United States Patent
Schuster et al.

(10) Patent No.: US 12,210,935 B2
(45) Date of Patent: Jan. 28, 2025

(54) TECHNOLOGIES FOR RESOURCE-EFFICIENT QUANTUM ERROR CORRECTION

(71) Applicant: THE UNIVERSITY OF CHICAGO, Chicago, IL (US)

(72) Inventors: David Schuster, Chicago, IL (US); Srivatsan Chakram, Chicago, IL (US)

(73) Assignee: THE UNIVERSITY OF CHICAGO, Chicago, IL (US)

( * ) Notice: Subject to any disclaimer, the term of this patent is extended or adjusted under 35 U.S.C. 154(b) by 818 days.

(21) Appl. No.: 17/435,307

(22) PCT Filed: Mar. 3, 2020

(86) PCT No.: PCT/US2020/020851
§ 371 (c)(1),
(2) Date: Aug. 31, 2021

(87) PCT Pub. No.: WO2020/180902
PCT Pub. Date: Sep. 10, 2020

(65) Prior Publication Data
US 2022/0156630 A1 May 19, 2022

Related U.S. Application Data

(60) Provisional application No. 62/813,107, filed on Mar. 3, 2019.

(51) Int. Cl.
*G06N 10/70* (2022.01)
*G06N 10/40* (2022.01)

(52) U.S. Cl.
CPC ............. *G06N 10/70* (2022.01); *G06N 10/40* (2022.01)

(58) Field of Classification Search
CPC .............................. G06N 10/40; G06N 10/60
See application file for complete search history.

(56) References Cited

U.S. PATENT DOCUMENTS

| | | | |
|---|---|---|---|
| 2008/0185576 | A1 | 8/2008 | Hollenberg et al. |
| 2012/0159272 | A1 | 6/2012 | Pesetski et al. |
| 2014/0365843 | A1 | 12/2014 | Ashikhmin |
| 2016/0125311 | A1 | 5/2016 | Fuechsle et al. |
| 2016/0191077 | A1 | 6/2016 | Goto et al. |

OTHER PUBLICATIONS

PCT Search Report prepared for PCT/US2020/020851, completed Apr. 29, 2020.

(Continued)

*Primary Examiner* — Samir W Rizk
(74) *Attorney, Agent, or Firm* — Barnes & Thornburg LLP

(57) ABSTRACT

Technologies for resource-efficient quantum error correction are disclosed. A quantum computer may include physical gate qubits, capable of general quantum gate operations such as single-qubit operations and nearest-neighbor two-qubit operations. Each physical qubit gate may be controllably coupled to a quantum memory. The quantum memory may have a lower per-gate error rate than the physical qubit gates as well as a lower per-qubit cost. Because errors accrue at a lower rate in the quantum memory, the physical gate qubits may be able to perform error correction for a large number of logical qubits in the quantum memory, even if the physical gate qubits have an error rate relatively close to an error threshold.

20 Claims, 3 Drawing Sheets

(56) References Cited

OTHER PUBLICATIONS

Levy, James E., et al.; "Implications of Electronics Constraints for Solid-State Quantum Error Correction and Quantum Circuit Failure Probability; Implications of Electronics Constraints for Solid-State Quantum Error Correction and Quantum Circuit Failure Probability 2011;" New Journal of Physics, Institute of Physics Publishing; vol. 13; Nr: 8; p. 83021.

TECHNOLOGIES FOR RESOURCE-EFFICIENT QUANTUM ERROR CORRECTION

CROSS-REFERENCE TO RELATED APPLICATIONS

The present application is a national stage entry under 35 U.S.C. § 371 (b) of PCT International Application No. PCT/US2020/020851, filed Mar. 3, 2020, which claims the benefit of U.S. Provisional Application No. 62/813,107, entitled "Technologies for Resource-Efficient Quantum Error Correction" and filed on Mar. 3, 2019, the entirety of both of which is are hereby incorporated by reference.

BACKGROUND

Quantum computing promises advances in solving problems that cannot be addressed with a classical computer, such as performing specific algorithms to efficiently solve certain problems, including, for example, factoring large numbers and performing simulations of large quantum systems. Quantum computers are susceptible to errors from sources such as unwanted interaction with the environment, but those errors can be corrected with quantum error correction techniques.

Quantum error correction techniques can be used to allow imperfect systems to implement quantum computing tasks with lower error rates than the error rate of a given physical gate qubit. However, there is a large overhead required to implement this quantum error correction, such as 1,000 to 10,000 physical gate qubits for each error-corrected logical qubit.

SUMMARY

According to one aspect of the disclosure, a system for resource-efficient quantum error correction comprises a plurality of physical gate qubits, wherein each of the plurality of physical gate qubits has an associated gate error rate; a quantum memory, wherein the quantum memory has an associated idle error rate, wherein the idle error rate of the quantum memory is less than the gate error rate of each of the plurality of physical gate qubits; and control components configured to perform an operation on a logical qubit using the plurality of physical gate qubits; transfer the logical qubit from the plurality of physical gate qubits to the quantum memory; store the logical qubit in the quantum memory for a time period based on the idle error rate of the quantum memory; transfer the logical qubit to the plurality of physical gate qubits; and perform a quantum error correcting code on the logical qubit using the plurality of physical gate qubits.

In some embodiments, the control components are further configured to sequentially perform an operation on each of a plurality of logical qubits using the plurality of physical gate qubits while the rest of the plurality of logical qubits are stored in the quantum memory; and sequentially perform the quantum error correcting code on each of the plurality of logical qubits while the rest of the plurality of logical qubits are stored in the quantum memory, wherein to sequentially perform the quantum error correcting code on each of the plurality of logical qubits comprises to transfer the corresponding logical qubit of the plurality of logical qubits from the quantum memory to the physical gate qubits; perform the quantum error correcting code on the corresponding logical qubit of the plurality of logical qubits using the plurality of physical gate qubits; and transfer the corresponding logical qubit of the plurality of logical qubits from the physical gate qubits to the quantum memory.

In some embodiments, to sequentially perform the quantum error correcting code on each of the plurality of logical qubits comprises to determine, for each of the plurality of logical qubits, an error parameter based on (i) the number of operations performed on the corresponding logical qubit while loaded in the physical gate qubits and (ii) the amount of time the corresponding logical qubit was stored in the quantum memory; determine, for each of the plurality of logical qubits, whether the corresponding error parameter is greater than a threshold value; and perform, for each of the plurality of logical qubits, the quantum error correcting code based on a determination that the corresponding error parameter is greater than the threshold value.

In some embodiments, the quantum error correcting code is a surface code.

In some embodiments, the quantum error correcting code is a Gottesman-Kitaev-Preskill (GKP) code.

In some embodiments, the quantum error correcting code is a bosonic mode code.

In some embodiments, the quantum error correcting code is a biased error quantum error correction code.

In some embodiments, to store the logical qubit in the quantum memory comprises to store the logical qubit in a plurality of physical memory qubits in the quantum memory, wherein the control components are further configured to perform single-qubit operations on the physical memory qubits.

In some embodiments, the plurality of physical gate qubits comprises a plurality of transmon qubits.

In some embodiments, the plurality of physical gate qubits comprises a plurality of fluxonium qubits.

In some embodiments, to store the logical qubit in the quantum memory comprises to store the logical qubit in a plurality of modes of a superconducting three-dimensional cavity.

In some embodiments, to store the logical qubit in the quantum memory comprises to store the logical qubit in a plurality of modes of a superconducting two-dimensional cavity with a high kinetic inductance.

In some embodiments, to store the logical qubit in the quantum memory comprises to store the logical qubit in a state of an electron spin or nuclear spin.

In some embodiments, to store the logical qubit in the quantum memory comprises to store the logical qubit in a plurality of modes of a nanomechanical resonator.

In some embodiments, the control components are further configured to simultaneously perform an operation on each of a plurality of logical qubits loaded in the plurality of physical gate qubits.

In some embodiments, the control components are further configured to perform a non-error-correcting operation on a first logical qubit of the plurality of logical qubits while simultaneously performing the quantum error correcting code on a second logical qubit of the plurality of logical qubits.

In some embodiments, to store the logical qubit in the quantum memory for the time period based on the idle error rate of the quantum memory comprises to store the logical qubit in the quantum memory based on the idle error rate of the quantum memory, the gate error rate of each of the plurality of physical gate qubits, and a transfer error rate associated with transfer of the logical qubit between the plurality of physical gate qubits and the quantum memory.

According to one aspect of the disclosure, a method of storing qubits in a quantum error corrected memory comprises performing an operation on a logical qubit using a plurality of physical gate qubits, wherein each of the plurality of physical gate qubits has an associated gate error rate; transferring the logical qubit from the plurality of physical gate qubits to a quantum memory; storing the logical qubit in the quantum memory for a time period based on an idle error rate of the quantum memory, wherein the idle gate error rate is less than the gate error rate of each of the plurality of physical gate qubits; transferring the logical qubit to the plurality of physical gate qubits; and performing a quantum error correcting code on the logical qubit using the plurality of physical gate qubits.

In some embodiments, the method may further include sequentially performing an operation on each of a plurality of logical qubits using the plurality of physical gate qubits while the rest of the plurality of logical qubits are stored in the quantum memory; and sequentially performing the quantum error correcting code on each of the plurality of logical qubits while the rest of the plurality of logical qubits are stored in the quantum memory, wherein sequentially performing the quantum error correcting code on each of the plurality of logical qubits comprises transferring the corresponding logical qubit of the plurality of logical qubits from the quantum memory to the physical gate qubits; performing the quantum error correcting code on the corresponding logical qubit of the plurality of logical qubits using the plurality of physical gate qubits; and transferring the corresponding logical qubit of the plurality of logical qubits from the physical gate qubits to the quantum memory.

In some embodiments, sequentially performing the quantum error correcting code on each of the plurality of logical qubits comprises determining, for each of the plurality of logical qubits, an error parameter based on (i) the number of operations performed on the corresponding logical qubit while loaded in the physical gate qubits and (ii) the amount of time the corresponding logical qubit was stored in the quantum memory; determining, for each of the plurality of logical qubits, whether the corresponding error parameter is greater than a threshold value; and performing, for each of the plurality of logical qubits, the quantum error correcting code based on a determination that the corresponding error parameter is past the threshold value.

In some embodiments, the quantum error correcting code is a surface code.

In some embodiments, the quantum error correcting code is a Gottesman-Kitaev-Preskill (GKP) code.

In some embodiments, the quantum error correcting code is a bosonic mode code.

In some embodiments, the quantum error correcting code is a biased error quantum error correction code.

In some embodiments, storing the logical qubit in the quantum memory comprises storing the logical qubit in a plurality of physical memory qubits in the quantum memory, the method further comprising performing single-qubit operations on the physical memory qubits.

In some embodiments, performing the operation on the logical qubit using the plurality of physical gate qubits comprises performing the operation on the logical qubit using a plurality of transmon qubits.

In some embodiments, performing the operation on the logical qubit using the plurality of physical gate qubits comprises performing the operation on the logical qubit using a plurality of fluxonium qubits.

In some embodiments, storing the logical qubit in the quantum memory comprises storing the logical qubit in a plurality of modes of a superconducting three-dimensional cavity.

In some embodiments, storing the logical qubit in the quantum memory comprises storing the logical qubit in a plurality of modes of a superconducting two-dimensional cavity with a high kinetic inductance.

In some embodiments, storing the logical qubit in the quantum memory comprises storing the logical qubit in a state of an electron spin or nuclear spin.

In some embodiments, storing the logical qubit in the quantum memory comprises storing the logical qubit in a plurality of modes of a nanomechanical resonator.

In some embodiments, the method may further include simultaneously performing an operation on each of a plurality of logical qubits loaded in the plurality of physical gate qubits.

In some embodiments, the method may further include performing a non-error-correcting operation on a first logical qubit of the plurality of logical qubits while simultaneously performing the quantum error correcting code on a second logical qubit of the plurality of logical qubits.

In some embodiments, storing the logical qubit in the quantum memory for the time period based on the idle error rate of the quantum memory comprises storing the logical qubit in the quantum memory based on the idle error rate of the quantum memory, the gate error rate of each of the plurality of physical gate qubits, and a transfer error rate associated with transfer of the logical qubit between the plurality of physical gate qubits and the quantum memory.

According to one aspect of the disclosure, a resource-efficient quantum error correction assembly comprises a quantum memory comprising a plurality of memory qubits having an associated idle error rate; and a quantum error correction circuit comprising a plurality of gate qubits having an associated error correction error rate, the idle error rate being less than the error correction error rate; wherein the quantum error correction circuit is configured to periodically perform a quantum error correction code on the plurality of memory qubits with a time period based on a ratio of the error correction error rate and the idle error rate.

In some embodiments, quantum error correcting operations comprise a surface code.

In some embodiments, quantum error correcting operations comprise a surface code having a code distance and the time period is based on a time when the numbers of idle errors is comparable to the code distance.

In some embodiments, the quantum error correcting code is a Gottesman-Kitaev-Preskill (GKP) code.

In some embodiments, the quantum error correcting code is a bosonic mode code.

In some embodiments, the quantum error correcting code is a biased error quantum error correction code.

In some embodiments, the plurality of memory qubits is a first logical qubit; the error correction circuit is associated with a plurality of logical qubits including the first logical qubit; and each logical qubit of the plurality of logical qubits has error correction code performed thereon periodically by the error correction code.

In some embodiments, the error correction circuit performs the error correction code sequentially on each of the logical qubits.

In some embodiments, the number of memory qubits in each logical qubit is based on the code distance, the idle error rate and the error correction error rate.

In some embodiments, the plurality of gate qubits of the error correction circuit is further configured to perform logical operations.

In some embodiments, the logical operations are fault-tolerant logical operations.

In some embodiments, the quantum memory is a random access quantum memory.

In some embodiments, the quantum memory comprises a superconducting three-dimensional cavity having a plurality of modes.

In some embodiments, the quantum memory comprises a plurality of electron spin states nuclear spin states.

In some embodiments, the quantum memory comprises a nanomechanical resonator having a plurality of modes.

In some embodiments, the plurality of gate qubits comprises a plurality of transmon qubits.

According to one aspect of the disclosure, a quantum computer comprises any of the resource-efficient quantum error correction assemblies described above.

According to one aspect of the disclosure, a quantum repeater comprises any of the resource-efficient quantum error correction assemblies described above.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
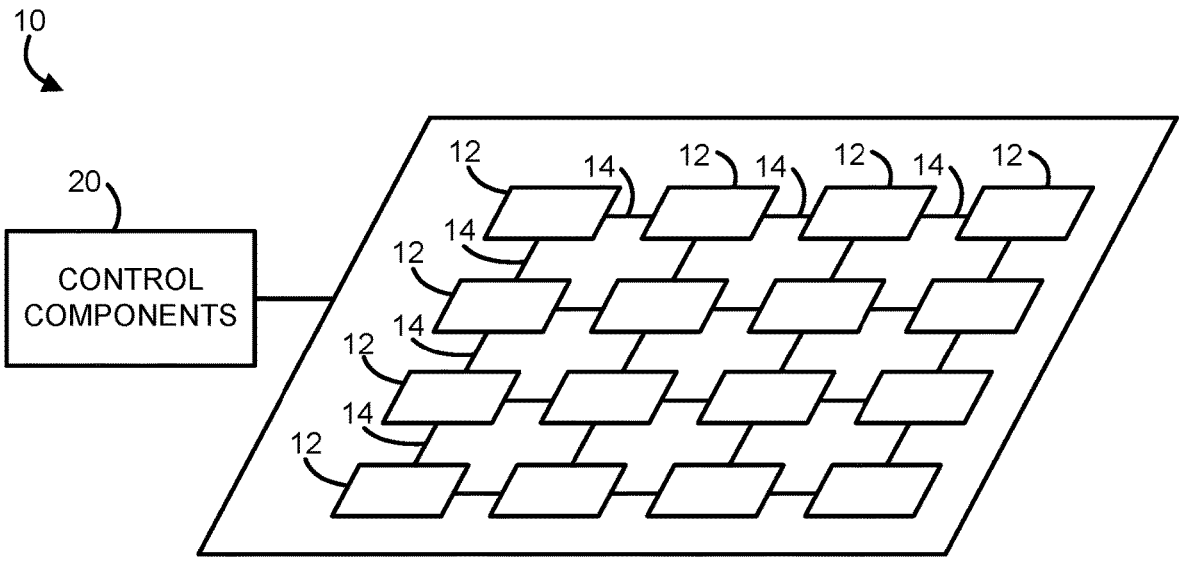
FIG. 1 is a schematic diagram of a quantum computer component with error-correction.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative quantum computer component 10 includes several physical gate qubits 12 connected by qubit couplers 14. In the illustrative embodiment, the physical gate qubits 12 are a type of charge qubit called a transmission-line shunted plasma oscillation qubit, or transmon. In other embodiments, the physical gate qubits 12 may be any suitable physical gate qubit capable of performing the functions described herein, such as an electron spin on helium qubit, an atomic electron spin qubit, a nuclear spin qubit, a trapped ion qubit, a superconducting charge qubit, a superconducting flux qubit, a superconducting phase qubit, a quantum dot, a nanomechanical system, a fluxonium qubit, etc. The physical gate qubits 12 are capable of performing the single and multi-qubit gates necessary to perform general quantum computing tasks. For example, in the illustrative embodiment, each physical gate qubit 12 is capable of single-qubit operations such as single-qubit initialization, single-qubit rotations, and single-qubit measurement. Each physical gate qubit 12 in the illustrative embodiment is further capable of two-qubit interactions with neighboring physical gate qubits 12, such as a controlled-NOT (CNOT) gate and a swap operation. It should be appreciated that, in some embodiments, some or all of the physical gate qubits 12 may be able to interact with ancilla qubits (not shown), which may facilitate performing certain operations on a logical qubit represented by the physical gate qubits 12, as discussed in more detail below.

A relatively small grid of 16 physical gate qubits 12 in a four by four grid is shown in FIG. 1 in the interest of clarity. However, it should be appreciated that the quantum computer component 10 may include many more qubits, such as 900 physical gate qubits 12 in an array of 30 by 30, or any number of qubits up to, e.g, $10^6$ arranged in a square, rectangular, or other grid pattern. It should be also appreciated that, while the physical gate qubits 12 may be physically laid out in a grid or grid-like pattern in some embodiments, the grid pattern is shown merely to indicate the nearest-neighbor interactions that are possible in the illustrative embodiment. More generally, the physical gate qubits 12 may be arranged in any suitable pattern or distribution, and the interactions possible between physical gate qubits 12 may not necessarily be limited to nearest-neighbor.

The qubit couplers 14 are configured to allow adjacent physical gate qubits 12 to interact. The physical implementation of the qubit couplers 14 will depend on the particular embodiments of the physical gate qubits 12. For example, if the physical gate qubits 12 are embodied as transmons, the qubit couplers 14 may be parametric Josephson couplers. If the physical gate qubits 12 are trapped ions, the qubit couplers 14 may be a system of lasers and other electronics capable of modulating the interaction between two physical gate qubits 12, including by physical movement of the physical gate qubits 12.

Operations on the physical gate qubits 12 will always have a chance of resulting in an error in the state of the physical gate qubits 12 after the operation. Each physical gate qubit 12 may have an associated gate error rate, and the gate error rate of the physical gate qubits 12 may be different. As used herein, unless noted otherwise, a gate error rate refers to a probability of some kind of an error that may occur in association with performing a gate on physical gate qubits 12. For example, a gate error rate may refer to a probability that a CNOT operation is followed by a random Pauli operator applied to one or both of the physical gate qubits 12 involved in the CNOT operation. It should be appreciated that, in various embodiments, the gate error rate may refer to different types of errors, such as a specific Pauli operator. Of course, in addition to errors caused during multi-qubit gates, the physical gate qubits 12 will be subject to some amount of errors in single-qubit operations, such as single-qubit rotations, measurement, and preparation.

In the illustrative embodiment, the physical gate qubits 12 are used to represent one or more logical qubits using a surface code, a type of error correcting code. Additionally or alternatively, in some embodiments, the physical gate qubits 12 may be used to implement a different type of error correction, such as a Steane code, a quantum low density parity check (LDPC) code, a Gottesman-Kitaev-Preskill (GKP) code, a multiple bosonic mode code, a biased error code, etc. The error correcting code may have a threshold for how high the gate error rate can be while still permitting error correction, such as 1% for a surface code. If the gate error gate is below the threshold by any amount, the error correcting code can be used to correct errors, although if the gate error is close to the threshold, the amount of resources required to implement the error correcting code may be large. The amount of error for performing a logic gates of a given physical gate qubit 12 (or physical gate qubits 12 for a multi-qubit gate) may be less than the error threshold for the error correcting code being implemented. For example, for a surface code with a 1% error threshold, the error rate for performing gates on the physical gate qubits 12 may be 0.1%. Of course, in some embodiments, the error rate for performing gates on the physical gate qubits 12 may be more or less than 0.1%, such as any error rate from 2% to $10^{-6}$. It should be appreciated that, for a given error threshold of the surface code and the error rate for performing gates on the physical gate qubits 12, the resilience of the logical qubit to errors will depend on the number of physical gate qubits 12 used to represent the logical qubit.

It should be appreciated that, by manipulation of the physical gate qubits 12, the state of the logical qubit manipulated. The logical qubit may undergo, e.g., single-qubit operations such as a $$Z = \begin{pmatrix} 1 & 0 \\ 0 & -1 \end{pmatrix}$$

operation, an $$X = \begin{pmatrix} 0 & 1 \\ 1 & 0 \end{pmatrix}$$

operation, or a Hadamard operation $$H = \frac{1}{\sqrt{2}} \begin{pmatrix} 1 & 1 \\ 1 & -1 \end{pmatrix}$$

by either manipulation of the physical gate qubits 12 or by implementing gates in the classical control software without any manipulation of the physical gate qubits 12. The logical qubits may undergo additional single-qubit operations such as $$S = \begin{pmatrix} 1 & 0 \\ 0 & i \end{pmatrix} \text{ or } T = \begin{pmatrix} 1 & 0 \\ 0 & e^{i\pi/4} \end{pmatrix},$$

also called the π/8 gate, by interacting with suitably-prepared ancilla qubits (not shown). Two-qubit gates between logical qubits is discussed in more detail below in regard to FIG. 3.

The quantum computer component 10 also includes control components 20. The control components 20 are capable of controlling the physical gate qubits 12 and the qubit couplers 14 shown in FIG. 1 and are capable of performing classical computing tasks, such as determining when error correction is required, what quantum gate operation should be performed, keeping track of gates implemented by software, etc. For example, if the physical gate qubits 12 are embodied as transmons, the control components 20 may be capable of controlling various current or voltage levels, applied magnetic fields, electromagnetic pulses applied to the physical gate qubits 12, etc. If the physical gate qubits 12 are embodied as trapped ions, the control components 20 may be capable of controlling a system of lasers and other electronics capable of modulating the interaction between two physical gate qubits 12, including by physical movement of the physical gate qubits 12. The control components 20 may be embodied as any suitable hardware or software capable of performing the functionality described herein, such as a classical computer, firmware, software, amplifiers, voltage sources, etc. In some embodiments, the control components 20 may compose or otherwise form a part of a quantum error correction circuit that is configured to perform or control the quantum error correction techniques described herein.

Figure 2:
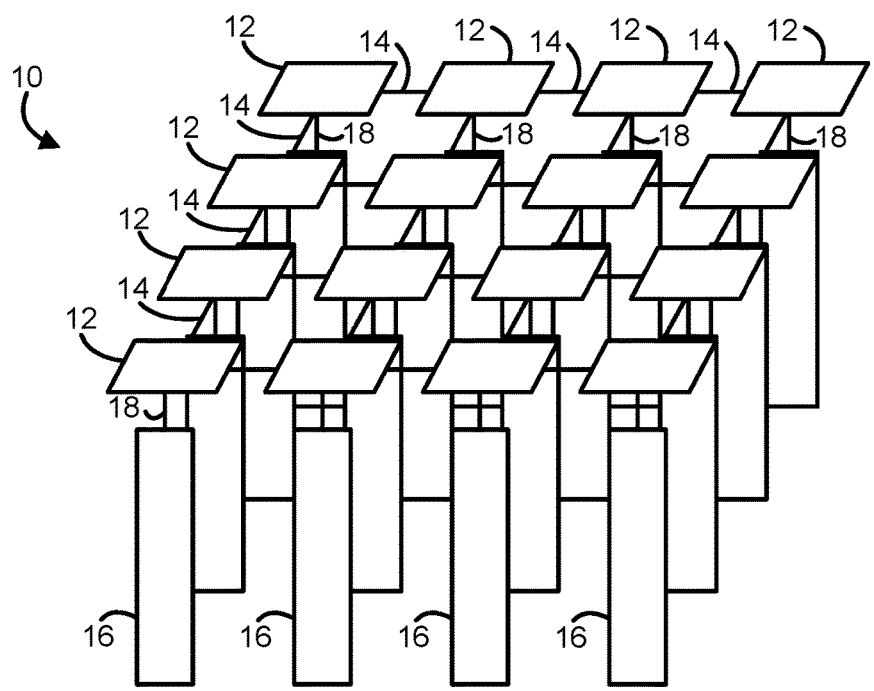
FIG. 2 is a schematic diagram of the quantum computer component of FIG. 1 with long-lived quantum memories.

Referring now to FIG. 2, the quantum computer component 10 may further include a quantum memory 16 coupled to each physical gate qubit 12 through a memory qubit coupler 18. (The quantum memories 16 are omitted in FIG. 1 in the interest of clarity, but may be present in embodiments of the quantum computer component 10 shown in FIG. 1.) The quantum memory 16 may include one or more physical memory qubits. In the illustrative embodiment, each quantum memory 16 is a multi-mode quantum memory with a relatively long lifetime. For example, in the illustrative embodiment, each quantum memory 16 may be a multi-mode 3-D superconducting resonator, as described in U.S. patent application publication no. 2019/0288367 by Schuster et al., entitled "TECHNOLOGIES FOR LONG-LIVED 3D MULTIMODE MICROWAVE CAVITIES," the entirety of which is incorporated by reference. Such a quantum memory 16 may have a large number of modes, such as 1,000 modes, each capable of operation as a physical memory qubit. In other embodiments, the quantum memories 16 may be a different type of quantum memory, such as a spin qubit, a photonic qubit, a nuclear qubit, a nanomechanical system, a two-dimensional multimode resonator, etc. For example, in some embodiments, a quantum memory may be embodied as one or more two-dimensional multimode resonators created with thin and narrow wires of a superconducting material with a high kinetic inductance. Such a resonator would have a slow effective speed of light and, as a result, a short effective wavelength. The short wavelength would permit resonators in small volumes far below the vacuum wavelength. Additionally, such resonators could have a meandering structure without significantly reducing the inductance. The memory qubit couplers 18, similar to the qubit couplers 14, are configured to allow physical gate qubits 12 to interact with the physical memory qubits in the corresponding quantum memory 16. In particular, the memory qubit couplers 18 are configured to swap the quantum state of the physical gate qubit 12 with the quantum state of a physical memory qubit in the quantum memory 16. The memory qubit couples 18 may swap the quantum state of the physical gate qubit 12 with the quantum state of any of the physical memory qubits in the quantum memory 16, allowing the quantum memory 16 to act as a random access memory, similar to a random access memory of a classical computer. The physical implementation of the memory qubit couplers 18 will depend on the particular embodiments of the physical gate qubits 12. For example, if the physical gate qubits 12 are embodied as transmons, the memory qubit couplers 18 may be parametric Josephson couplers.

The idle error rate of the quantum memory 16 refers to the probability of a single-qubit error in a unit of time associated with the physical gate qubits 12, such as the amount of time it takes to perform a multi-qubit operation on the physical gate qubits 12. For example, the idle error rate of the quantum memory 16 may refer to the probability that a random Pauli matrix is applied to any given qubit stored in the quantum memory in the time it takes to perform a multi-qubit operation on the physical gate qubits 12. In the illustrative embodiment, the quantum memory 16 is embodied as a 3-D superconducting resonator with qubits stored as electromagnetic modes in the resonator, with a per-gate idle error rate of, e.g., $10^{-6}$. In other embodiments, the per-gate idle error rate may be other values, such as any value from $10^{-3}$ to $10^{-6}$. It should be appreciated that, in some embodiments, each mode of a multi-mode quantum memory 16 may have a different error rate. An idle error rate of a quantum memory 16 may refer to a maximum error rate of the modes supported by the quantum memory 16, an average error rate of the modes supported by the quantum memory 16, or an error rate of a particular mode of the quantum memory 16. There may be an additional error rate associated with querying the quantum memory 16, such as storing a logical qubit from the physical gate qubits 12 to the quantum memory 16 or loading a logical qubit from the quantum memory 16 to the physical gate qubits 12. The query error rate for such a transfer may be, e.g., 0.1%.

In the illustrative embodiment, the quantum memory 16 can store qubits but cannot otherwise manipulate them. In other embodiments, such as when the quantum memory 16 is a nuclear spin, the quantum memory 16 may be able to perform certain operations on qubits stored in the quantum memory, such as single-qubit gates, measurement, or two-qubit gates with only one other qubit.

It should be appreciated that the lower error rate of the quantum memories 16 may permit the quantum computer component 10 to concurrently maintain a larger number of error-corrected logical qubits than can be loaded into the physical gate qubits 12 at any one time. For example, if the per-gate error rate is 0.1% for the physical gate qubits and the per-gate error rate for idle qubits in the quantum memory 16 is $10^{-6}$, error correction will have to be performed on the qubits in the quantum memory 16 approximately one thousand times less often than if the qubits stored in the quantum memory 16 were subject to the same error rate as the physical gate qubits 12. Such an approach allows for implementation of a quantum computer component 10 that has access to a large number of logical qubits with a relatively small number of physical gate qubits 12. Additionally, the per-qubit cost of the quantum memory 16 may be significantly lower than the per-qubit cost of the gate qubits. For example, a single quantum memory 16 made up of a single 3-D resonator may be able to store 1,000 qubits, while a single physical qubit 12 can only store one qubit.

In the illustrative embodiment, the error correcting code may be performed on the physical gate qubits 12 to correct any errors in the logical qubit. The error correcting code may be performed by performing single- and two-qubit gates and measurements on some or all of the physical gate qubits 12. The particular operations to be performed will depend on the error correcting code that is being used. The error correcting code may be performed continuously, continually, periodically, or when certain conditions are met. The conditions may be, e.g., when an error parameter reaches a certain threshold. An error parameter could be any parameter than indicates a likelihood of an error in a logical qubit. For example, an error parameter could be embodied as a sum of all errors accumulated by individual operations (i.e., three operations performed with a gate error rate of 0.1% could be represented by an error parameter of 0.3%). An error parameter could also be embodied as a probability of an unrecoverable error in the physical qubits 12 such that the value of the logical qubit cannot be corrected. An error parameter could also be embodied as a probability of an error in an individual physical qubit 12. An error parameter can represent errors from more than one source, such as from a gate error, an idle error in the physical qubit 12, an idle error in the quantum memory 16, a transfer error to or from the quantum memory 16, etc. More generally, the calculation of an error parameter may depend on the particular error correcting code, the types of errors present in a given system, the number of physical gate qubits 12 used to represent a logical qubit, etc. The threshold used to determine when error correction is to be performed may also depend on the particular error correcting code, the types of errors present in a given system, the number of physical gate qubits 12 used to represent a logical qubit, a desired error rate of the logical qubits, etc.

It should be appreciated that the quantum computer component 10 may include control components 20 similar to those described in regard to FIG. 1 capable of controlling quantum memories 16 and the memory qubit couplers 18. The control components 20 are omitted from FIG. 2 in the interest of clarity.

Figure 3:
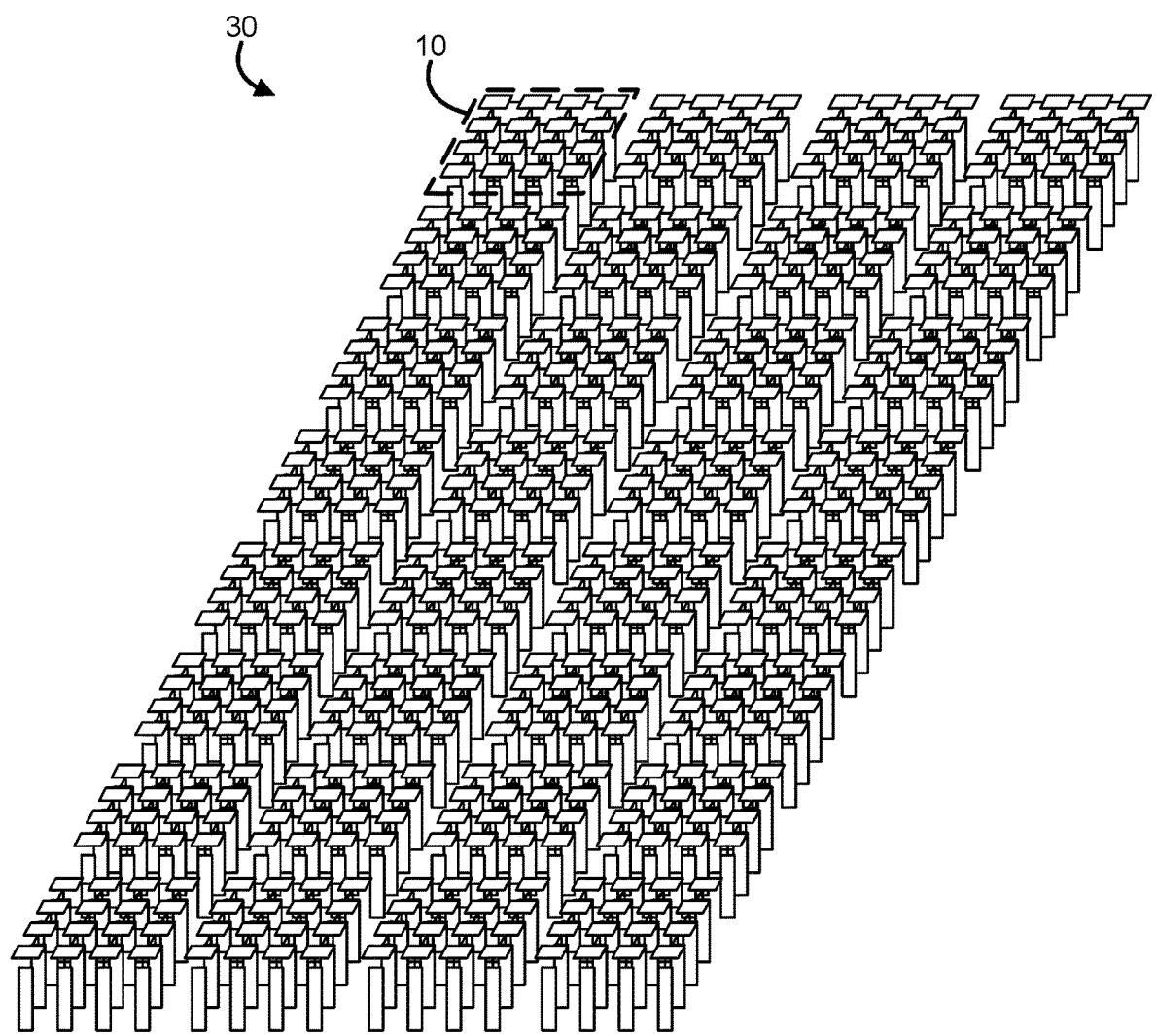
FIG. 3 is a schematic diagram of a quantum computer that includes the quantum computer component with long-lived quantum memories of FIG. 2.

Referring now to FIG. 3, a quantum computer 30 may include several quantum computer components 10. The illustrative quantum computer 30 includes 32 quantum computer components 10, one of which is labeled as such in FIG. 3. As noted above, each quantum computer component 10 may be able to represent one or more logical qubits in its physical gate qubits 12. The quantum computer 30 may then be able to represent several logical qubits, such as one logical qubit in each of 32 quantum computer components 10.

The quantum computer 30 is able to perform two-qubit gates between the logical qubits represented in different quantum computer components 10. In the illustrative embodiment, the quantum computing components 10 may be arranged in a grid, such as a four by eight grid shown in FIG. 3. In such an embodiment, physical gate qubits 12 in one quantum computer component 10 are able to interact with adjacent physical gate qubits 12 in the adjacent quantum computer component 10. It should be appreciated, however, that such an arrangement is merely one possibility, and the particular configuration may depend on the underlying physical gate qubits 12 used and the capabilities of those qubits. For example, the quantum computer 30 may include a different number of quantum computing components 10, such as any number from 2 to 128. It also should be appreciated that, in the illustrative embodiment, the configuration of the quantum computer 30 shown in FIG. 3 is a grid of 16 by 32 physical gate qubits 12. While the quantum computer 30 may separate the physical gate qubits 32 into blocks of quantum computing components 10, each of which represents a logical qubit, the quantum computer 30 may control the physical gate qubits 12 to operate in a different manner in different circumstances. For example, the quantum computer 30 may use a grid of 100 by 100 physical gate qubits 12 to represent 25 logical qubits, each corresponding to a grid of 20 by 20 physical gate qubits 12, and then the quantum computer 30 may use the same grid of 100 by 100 physical gate qubits 12 to represent 4 logical qubits, each corresponding to a grid of 50 by 50 physical gate qubits 12. It should be appreciated that using a larger number of physical gate qubits 12 will lead to better error protection at a cost of fewer logical qubits. Although shown as a grid 16 by 32 physical gate qubits 12, the quantum computer 30 may be include a grid of a different number of physical gate qubits 12, such as 120 by 240. More generally, the quantum computer 30 may include any number of physical gate qubits 12 that are able to perform nearest-neighbor interaction, such as any number from 2 to $10^6$.

The approach to executing gates between logical qubits represented in different quantum computing components 10 may depend on the error correcting code used. For example, with a surface code, the quantum computer 30 may perform two-qubit gates between logical gates by performing a topological braid transformation that provides the logical CNOT operation in the logical qubits represented in the surface code. Interactions can also be done between logical qubits present in the same quantum computing component 10, such as between a first logical qubit present in the physical gate qubits 12 and a second logical qubit present in the quantum memory 16 of a selected quantum computing component 10. Such an interaction can be done by swapping the first logical qubit present in the physical gate qubits 12 of the selected quantum computing component 10 with the logical qubit in an adjacent quantum computing component 10, bringing the second logical qubit into the physical gate qubits 12 of the selected quantum computing component 10, and then interacting the two logical qubits present in the selected quantum computing component 10 and the adjacent quantum computing component 10. It should be appreciated that, in this way, any logical qubit in the quantum computer 30 can interact with any other logical qubit in the quantum computer 30. In analogy to a classical computer, the physical gate qubits 12 act as the classical processor, able to perform general computing tasks, and the quantum memory 16 acts as the classical memory, storing data that can be loaded into the processor.

As discussed above in regard to FIG. 2, it should be appreciated that, in addition to hardware to implement the quantum computing components 10, the quantum computer 30 may include control hardware and software capable of controlling the hardware shown in FIG. 3 and capable of performing classical computing tasks, such as determining when error correction is required, what quantum gate operation should be performed, keeping track of gates implemented by software, etc. The classical control hardware and software is not shown in FIG. 3 in the interest of clarity.

Figure 4:
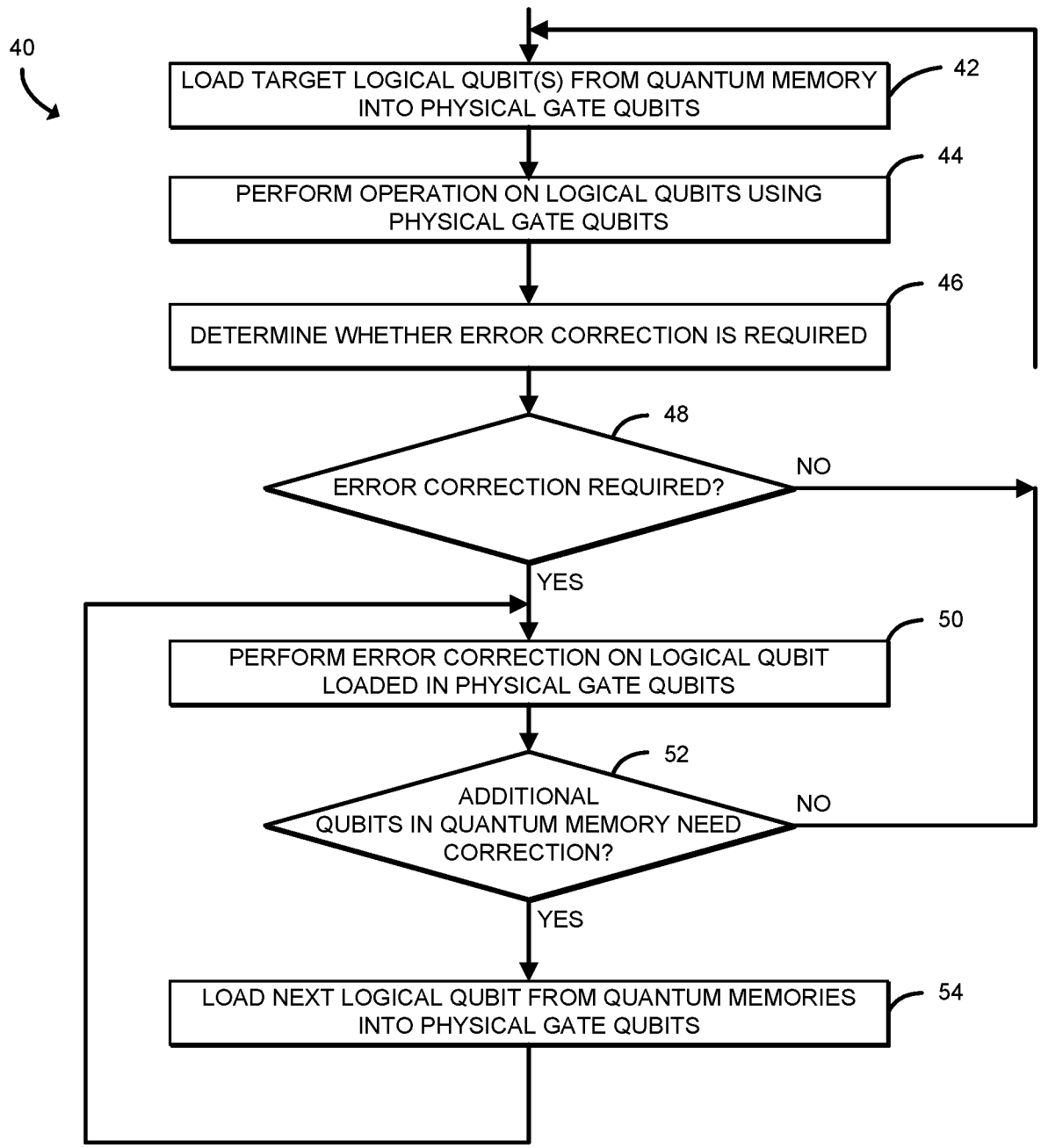
FIG. 4 is a flow chart of a method of operating the quantum computer of FIG. 3.

Referring now to FIG. 4, in use, the quantum computer 30 may perform a method 40 for performing quantum computing tasks. The method 40 begins in block 42, in which the quantum computer 30 loads target logical qubits from the quantum memory 16 into the physical gate qubits 12. Of course, in some instances, the target logical qubits may already be present in the physical gate qubits 12, and no loading from the quantum memory 16 may be required.

In block 44, in which the quantum computer 30 performs an operation on the logical qubits using the physical gate qubits 12, such as a single- or multi-qubit gate. As discussed in more detail above, the operations on the logical qubits may be performed by performing single- and multi-qubit gates on the physical gate qubits 12, and the particular approach to performing operations on the logical qubits may depend on the particular implementation of an error correcting code.

In block 46, the quantum computer 30 determines whether error correction is required. The quantum computer 30 may determine whether error correction is required for the logical qubits present in some or all of the physical gate qubits 12 and/or may determine whether error correction is required for the logical qubits present in some or all of the quantum memory 16. An error correction may be required when an error parameter has reached a threshold value or will reach a threshold value by the time error correction can be performed. For example, multiple logical qubits in the quantum memory 16 may have a similar value for an error parameter that is slightly below the threshold. If the quantum computer 30 waits to perform error correction until the error parameters for all of those logical qubits are past the threshold, the errors will continue to accumulate past the error threshold for some of the logical qubits while the other logical qubits are having their errors corrected. It should be appreciated that, in some embodiments, the quantum computer 30 may determine that error correction is required for all of the logical qubits, and error correction may then be performed on each of the logical qubits in the quantum computer 30. In other embodiments, the quantum computer 30 may determine that error correction is only required for a subset of the logical qubits, and logical operations may be performed on some logical qubits in the physical gate qubits 12 of the quantum computer 30 at the same time that error correction operations are being performed on other logical qubits in the physical gate qubits 12 of the quantum computer 30.

In block 48, if the quantum computer 30 determines that error correction should not be performed, the method 400 loops back to block 42, in which the quantum computer 30 loads a target logical qubit from the quantum memory 16 into the physical gate qubits 12. If the quantum computer 30 determines that error correction should be performed, the method 400 proceeds to block 50. In block 50, the quantum computer 30 performs error correction on some or all of the logical qubits present in the physical gate qubits 12.

In block 52, the quantum computer determines whether additional error correction is required, such as on logical qubits present in the quantum memory 16. If the quantum computer determines that additional error is not required, the method 400 loops back to block 42, in which the quantum computer 30 loads a target logical qubit from the quantum memory 16 into the physical gate qubits 12. If the quantum computer determines that additional error is required, the quantum computer 30 loads the next logical qubit selected for error correction from the quantum memory 16 into the physical gate qubits 12 in block 54, storing the logical qubit previously present in the physical gate qubits 12 in the quantum memory 16. The method 400 then loops back to block 50 to perform error correction on the logical qubit loaded into the physical gate qubits 12.

It should be appreciated that, in some embodiments, the quantum computer 30 may not be able to perform large-scale quantum computing tasks without error. For example, in some embodiments, all of the physical gate qubits 12 may have a gate error rate that is below the threshold for an error correcting code, but the quantum computer 30 may not have enough physical gate qubits 12 to correct errors in a logical qubit represented by the physical gate qubits 12 at an acceptably low error level. Such a quantum computer 30 may still perform complex quantum computing tasks suitable for, e.g., testing and/or simulation. In some embodiments, the quantum computer 30 may be incorporated into a quantum repeater, allowing for long-distance quantum communication such as quantum cryptography.

What is claimed is:

1. A system for resource-efficient quantum error correction, the system comprising:
   a plurality of physical gate qubits, wherein each of the plurality of physical gate qubits has an associated gate error rate;
   a quantum memory, wherein the quantum memory has an associated idle error rate, wherein the idle error rate of the quantum memory is less than the gate error rate of each of the plurality of physical gate qubits; and
   control components configured to:
      perform an operation on a logical qubit using the plurality of physical gate qubits;
      transfer the logical qubit from the plurality of physical gate qubits to the quantum memory;
      store the logical qubit in the quantum memory for a time period based on the idle error rate of the quantum memory;
      transfer the logical qubit to the plurality of physical gate qubits; and
      perform a quantum error correcting code on the logical qubit using the plurality of physical gate qubits.

2. The system of claim 1, wherein the control components are further configured to:
   sequentially perform an operation on each of a plurality of logical qubits using the plurality of physical gate qubits while the rest of the plurality of logical qubits are stored in the quantum memory; and
   sequentially perform the quantum error correcting code on each of the plurality of logical qubits while the rest of the plurality of logical qubits are stored in the quantum memory,
   wherein to sequentially perform the quantum error correcting code on each of the plurality of logical qubits comprises to:
      transfer the corresponding logical qubit of the plurality of logical qubits from the quantum memory to the physical gate qubits;
      perform the quantum error correcting code on the corresponding logical qubit of the plurality of logical qubits using the plurality of physical gate qubits; and
      transfer the corresponding logical qubit of the plurality of logical qubits from the physical gate qubits to the quantum memory.

3. The system of claim 2, wherein to sequentially perform the quantum error correcting code on each of the plurality of logical qubits comprises to:
   determine, for each of the plurality of logical qubits, an error parameter based on (i) the number of operations performed on the corresponding logical qubit while loaded in the physical gate qubits and (ii) the amount of time the corresponding logical qubit was stored in the quantum memory;
   determine, for each of the plurality of logical qubits, whether the corresponding error parameter is greater than a threshold value; and
   perform, for each of the plurality of logical qubits, the quantum error correcting code based on a determination that the corresponding error parameter is greater than the threshold value.

4. The system of claim 1, wherein the quantum error correcting code is a surface code.

5. The system of claim 1, wherein the quantum error correcting code is a Gottesman-Kitaev-Preskill (GKP) code.

6. The system of claim 1, wherein the quantum error correcting code is a bosonic mode code.

7. The system of claim 1, wherein the quantum error correcting code is a biased error quantum error correction code.

8. The system of claim 1, wherein to store the logical qubit in the quantum memory comprises to store the logical qubit in a plurality of physical memory qubits in the quantum memory,
   wherein the control components are further configured to perform single-qubit operations on the physical memory qubits.

9. The system of claim 1, wherein the plurality of physical gate qubits comprises a plurality of transmon qubits.

10. The system of claim 1, wherein the plurality of physical gate qubits comprises a plurality of fluxonium qubits.

11. The system of claim 1, wherein the control components are further configured to simultaneously perform an operation on each of a plurality of logical qubits loaded in the plurality of physical gate qubits.

12. The system of claim 11, wherein the control components are further configured to perform a non-error-correcting operation on a first logical qubit of the plurality of logical qubits while simultaneously performing the quantum error correcting code on a second logical qubit of the plurality of logical qubits.

13. A method of storing qubits in a quantum error corrected memory, the method comprising:
   performing an operation on a logical qubit using a plurality of physical gate qubits, wherein each of the plurality of physical gate qubits has an associated gate error rate;
   transferring the logical qubit from the plurality of physical gate qubits to a quantum memory;
   storing the logical qubit in the quantum memory for a time period based on an idle error rate of the quantum memory, wherein the idle gate error rate is less than the gate error rate of each of the plurality of physical gate qubits;

transferring the logical qubit to the plurality of physical gate qubits; and performing a quantum error correcting code on the logical qubit using the plurality of physical gate qubits.

14. The method of claim 13, further comprising:

sequentially performing an operation on each of a plurality of logical qubits using the plurality of physical gate qubits while the rest of the plurality of logical qubits are stored in the quantum memory; and sequentially performing the quantum error correcting code on each of the plurality of logical qubits while the rest of the plurality of logical qubits are stored in the quantum memory, wherein sequentially performing the quantum error correcting code on each of the plurality of logical qubits comprises:

transferring the corresponding logical qubit of the plurality of logical qubits from the quantum memory to the physical gate qubits;

performing the quantum error correcting code on the corresponding logical qubit of the plurality of logical qubits using the plurality of physical gate qubits; and transferring the corresponding logical qubit of the plurality of logical qubits from the physical gate qubits to the quantum memory.

15. The method of claim 14, wherein sequentially performing the quantum error correcting code on each of the plurality of logical qubits comprises:

determining, for each of the plurality of logical qubits, an error parameter based on (i) the number of operations performed on the corresponding logical qubit while loaded in the physical gate qubits and (ii) the amount of time the corresponding logical qubit was stored in the quantum memory;

determining, for each of the plurality of logical qubits, whether the corresponding error parameter is greater than a threshold value; and performing, for each of the plurality of logical qubits, the quantum error correcting code based on a determination that the corresponding error parameter is past the threshold value.

16. The method of claim 13, wherein the quantum error correcting code is a surface code.

17. The method of claim 13, wherein the quantum error correcting code is a Gottesman-Kitaev-Preskill (GKP) code.

18. The method of claim 13, wherein the quantum error correcting code is a bosonic mode code.

19. The method of claim 13, wherein the quantum error correcting code is a biased error quantum error correction code.

20. The method of claim 18, wherein storing the logical qubit in the quantum memory comprises storing the logical qubit in a plurality of physical memory qubits in the quantum memory, the method further comprising performing single-qubit operations on the physical memory qubits.

* * * * *